US009303827B2

(12) United States Patent
Aeling et al.

(10) Patent No.: US 9,303,827 B2
(45) Date of Patent: *Apr. 5, 2016

(54) ILLUMINATION DEVICES AND METHODS FOR MAKING THE SAME

(71) Applicant: 3M INNOVATIVE PROPERTIES COMPANY, St. Paul, MN (US)

(72) Inventors: Ellen O. Aeling, Oakdale, MN (US); John R. David, Stillwater, MN (US); Michael A. Meis, Stillwater, MN (US); Ronald S. Steelman, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 38 days.

This patent is subject to a terminal disclaimer.

(21) Appl. No.: 14/306,337

(22) Filed: Jun. 17, 2014

(65) Prior Publication Data

US 2014/0293602 A1 Oct. 2, 2014

Related U.S. Application Data

(63) Continuation of application No. 13/955,455, filed on Jul. 31, 2013, now Pat. No. 8,860,296, which is a continuation of application No. 11/756,971, filed on Jun. 1, 2007, now Pat. No. 8,525,402.

(60) Provisional application No. 60/825,245, filed on Sep. 11, 2006.

(51) Int. Cl.
*F21V 19/00* (2006.01)
*F21V 21/002* (2006.01)
(Continued)

(52) U.S. Cl.
CPC ... *F21K 9/50* (2013.01); *F21K 9/30* (2013.01); *F21K 9/90* (2013.01); *F21V 19/0015* (2013.01);
(Continued)

(58) Field of Classification Search
CPC ............... H05K 1/11; H05K 1/189; H05K 2201/09236; H05K 2201/10106; H05K 2201/09672; H05K 2203/063
See application file for complete search history.

(56) References Cited

U.S. PATENT DOCUMENTS 3,383,641 A 5/1968 Piel
3,894,225 A 7/1975 Chao
(Continued)

FOREIGN PATENT DOCUMENTS

DE 4233570 3/1994
DE 4340996 3/1995
(Continued)

OTHER PUBLICATIONS

Biercuk, "Carbon Nanotube Composites for Thermal Management", Applied Physics Letters, Apr. 15, 2002, vol. 80, No. 15, pp. 2767-2769.
(Continued)

*Primary Examiner* — Mariceli Santiago
(74) *Attorney, Agent, or Firm* — Steven Bern

(57) ABSTRACT

The present disclosure is generally directed to illumination devices, and methods for making the same. The device, in particular, includes a first conductor layer, a first insulator layer disposed on the first conductor layer and having at least one first aperture defined therein through the first insulator layer, a second conductor layer disposed on the first insulator layer and having at least one second aperture defined therein through the second conductor layer and positioned to align with the at least one first aperture, and a light manipulation layer disposed on the second conductor layer and having at least one pair of apertures defined therein through the light manipulation layer including a third aperture and a fourth aperture, where the third aperture is positioned to align with the at least one second and first apertures.

13 Claims, 7 Drawing Sheets

(51) Int. Cl.
*F21K 99/00* (2010.01)
*H05K 1/11* (2006.01)
*H05K 1/18* (2006.01)
*H01L 33/60* (2010.01)
*H05K 1/02* (2006.01)
*H05K 3/22* (2006.01)
*H05K 3/46* (2006.01)
*F21Y 101/02* (2006.01)

(52) U.S. Cl.
CPC ............ *F21V 19/0025* (2013.01); *H01L 33/60* (2013.01); *H05K 1/11* (2013.01); *H05K 1/189* (2013.01); *F21K 9/00* (2013.01); *F21Y 2101/02* (2013.01); *H05K 1/0287* (2013.01); *H05K 3/222* (2013.01); *H05K 3/4611* (2013.01); *H05K 2201/09681* (2013.01); *H05K 2201/10106* (2013.01); *H05K 2201/10363* (2013.01); *H05K 2203/063* (2013.01); *Y10T 156/10* (2015.01)

(56) References Cited

U.S. PATENT DOCUMENTS

| | | |
|---|---|---|
| 4,271,408 A | 6/1981 | Teshima |
| 4,409,981 A | 10/1983 | Lundberg |
| 4,502,761 A | 3/1985 | Knoll |
| 4,542,449 A | 9/1985 | Whitehead |
| 4,588,258 A | 5/1986 | Hoopman |
| 4,764,410 A | 8/1988 | Grzywinski |
| 4,766,023 A | 8/1988 | Lu |
| 4,775,219 A | 10/1988 | Appeldorn |
| 4,791,540 A | 12/1988 | Dreyer |
| 4,799,131 A | 1/1989 | Aho |
| 4,846,922 A | 7/1989 | Benge |
| 4,883,341 A | 11/1989 | Whitehead |
| 4,984,144 A | 1/1991 | Cobb |
| 5,056,892 A | 10/1991 | Cobb |
| 5,094,788 A | 3/1992 | Schrenk |
| 5,122,902 A | 6/1992 | Benson |
| 5,122,905 A | 6/1992 | Wheatley |
| 5,122,906 A | 6/1992 | Wheatley |
| 5,138,488 A | 8/1992 | Szczech |
| 5,161,041 A | 11/1992 | Abileah |
| 5,175,030 A | 12/1992 | Lu |
| 5,183,597 A | 2/1993 | Lu |
| 5,217,794 A | 6/1993 | Schrenk |
| 5,254,388 A | 10/1993 | Melby |
| 5,269,995 A | 12/1993 | Ramanathan |
| 5,303,322 A | 4/1994 | Winston |
| 5,310,355 A | 5/1994 | Dannatt |
| 5,321,593 A | 6/1994 | Moates |
| 5,353,154 A | 10/1994 | Lutz |
| 5,389,324 A | 2/1995 | Lewis |
| 5,450,285 A | 9/1995 | Schlemmer |
| 5,528,720 A | 6/1996 | Winston |
| 5,594,830 A | 1/1997 | Winston |
| 5,626,800 A | 5/1997 | Williams |
| 5,645,932 A | 7/1997 | Uchibori |
| 5,703,664 A | 12/1997 | Jachimowicz |
| 5,751,388 A | 5/1998 | Larson |
| 5,759,422 A | 6/1998 | Schmelzer |
| 5,771,328 A | 6/1998 | Wortman |
| 5,783,120 A | 7/1998 | Ouderkirk |
| 5,793,456 A | 8/1998 | Broer |
| 5,808,794 A | 9/1998 | Weber |
| 5,818,627 A | 10/1998 | Perlo |
| 5,825,542 A | 10/1998 | Cobb |
| 5,825,543 A | 10/1998 | Ouderkirk |
| 5,828,488 A | 10/1998 | Ouderkirk |
| 5,840,405 A | 11/1998 | Shusta |
| 5,857,767 A | 1/1999 | Hochstein |
| 5,858,139 A | 1/1999 | Ouderkirk |
| 5,867,316 A | 2/1999 | Carlson |
| 5,872,653 A | 2/1999 | Schrenk |
| 5,882,774 A | 3/1999 | Jonza |
| 5,908,874 A | 6/1999 | Fong |
| 5,917,664 A | 6/1999 | O'Neill |
| 5,919,551 A | 7/1999 | Cobb |
| 5,962,114 A | 10/1999 | Jonza |
| 5,965,247 A | 10/1999 | Jonza |
| 5,976,424 A | 11/1999 | Weber |
| 5,987,204 A | 11/1999 | Lee |
| 5,991,077 A | 11/1999 | Carlson |
| 5,999,239 A | 12/1999 | Larson |
| 6,005,713 A | 12/1999 | Carlson |
| 6,018,419 A | 1/2000 | Cobb |
| 6,025,897 A | 2/2000 | Weber |
| 6,031,665 A | 2/2000 | Carlson |
| 6,052,164 A | 4/2000 | Cobb |
| 6,057,961 A | 5/2000 | Allen |
| 6,080,467 A | 6/2000 | Weber |
| 6,088,067 A | 7/2000 | Willett |
| 6,088,159 A | 7/2000 | Weber |
| 6,088,163 A | 7/2000 | Gilbert |
| 6,091,547 A | 7/2000 | Gardiner |
| 6,101,032 A | 8/2000 | Wortman |
| 6,111,696 A | 8/2000 | Allen |
| 6,117,530 A | 9/2000 | Jonza |
| 6,122,103 A | 9/2000 | Perkins |
| 6,124,971 A | 9/2000 | Ouderkirk |
| 6,132,859 A | 10/2000 | Jolly |
| 6,140,707 A | 10/2000 | Plepys |
| 6,141,149 A | 10/2000 | Carlson |
| 6,148,130 A | 11/2000 | Lee |
| 6,153,508 A | 11/2000 | Harvey |
| 6,157,490 A | 12/2000 | Wheatley |
| 6,179,948 B1 | 1/2001 | Merrill |
| 6,208,466 B1 | 3/2001 | Liu |
| 6,210,785 B1 | 4/2001 | Weber |
| 6,246,010 B1 | 6/2001 | Zenner |
| 6,256,146 B1 | 7/2001 | Merrill |
| 6,262,842 B1 | 7/2001 | Ouderkirk |
| 6,268,070 B1 | 7/2001 | Bergstresser |
| 6,280,063 B1 | 8/2001 | Fong |
| 6,280,822 B1 | 8/2001 | Smith |
| 6,287,670 B1 | 9/2001 | Benson |
| 6,288,172 B1 | 9/2001 | Goetz |
| 6,296,927 B1 | 10/2001 | Jonza |
| 6,340,518 B1 | 1/2002 | Kitahara |
| 6,346,298 B1 | 2/2002 | Takahashi |
| 6,458,465 B1 | 10/2002 | Uchibori |
| 6,585,846 B1 | 7/2003 | Hanson |
| 6,618,939 B2 | 9/2003 | Uchibori |
| 6,657,381 B1 | 12/2003 | Arutaki |
| 6,752,505 B2 | 6/2004 | Parker |
| 6,762,510 B2 | 7/2004 | Fock |
| 6,764,210 B2 | 7/2004 | Akiyama |
| 6,788,541 B1 | 9/2004 | Hsiung |
| 6,855,404 B2 | 2/2005 | Anderson |
| 6,905,774 B2 | 6/2005 | Takahashi |
| 6,916,544 B2 | 7/2005 | Moriyama |
| 6,924,024 B2 | 8/2005 | Narui |
| 6,969,189 B2 | 11/2005 | Lee |
| 6,974,229 B2 | 12/2005 | West |
| 6,976,779 B2 | 12/2005 | Ohtsuki |
| 6,988,666 B2 | 1/2006 | Appalucci |
| 7,000,999 B2 | 2/2006 | Ryan, Jr. |
| 7,052,924 B2 | 5/2006 | Daniels |
| 7,101,619 B2 | 9/2006 | Nishinaka |
| 7,116,227 B2 | 10/2006 | Eckstein |
| 7,119,685 B2 | 10/2006 | Eckstein |
| 7,138,919 B2 | 11/2006 | Clare |
| 7,175,736 B2 | 2/2007 | Sakayori |
| 7,563,641 B2 | 7/2009 | Wang |
| 7,665,883 B2 | 2/2010 | Matheson |
| 8,525,402 B2 * | 9/2013 | Aeling .................... H05K 1/11 313/498 |
| 2002/0006040 A1 | 1/2002 | Kamada |
| 2002/0159019 A1 | 10/2002 | Pokorny |
| 2003/0063463 A1 | 4/2003 | Sloan |
| 2003/0122844 A1 | 7/2003 | Mueller |
| 2003/0211797 A1 | 11/2003 | Hill |
| 2003/0222559 A1 | 12/2003 | Cok |

(56) References Cited

U.S. PATENT DOCUMENTS

| | | |
|---|---|---|
| 2004/0032727 A1 | 2/2004 | Cok |
| 2004/0090794 A1 | 5/2004 | Ollett |
| 2004/0130515 A1 | 7/2004 | Chuang |
| 2004/0223328 A1 | 11/2004 | Lee |
| 2005/0002194 A1 | 1/2005 | Kikuchi |
| 2005/0024754 A1 | 2/2005 | Epstein |
| 2005/0195341 A1 | 9/2005 | Koganezawa |
| 2005/0195588 A1 | 9/2005 | Kang |
| 2005/0207156 A1 | 9/2005 | Wang |
| 2005/0212007 A1 | 9/2005 | Daniels |
| 2005/0214962 A1 | 9/2005 | Daniels |
| 2005/0231935 A1 | 10/2005 | Kimmet |
| 2006/0202850 A1 | 9/2006 | Hefright |
| 2006/0217690 A1 | 9/2006 | Bastin |
| 2007/0072506 A1 | 3/2007 | Wang |
| 2007/0216274 A1 | 9/2007 | Schultz |
| 2008/0062688 A1 | 3/2008 | Aeling |
| 2008/0074871 A1 | 3/2008 | Meis |
| 2008/0295327 A1 | 12/2008 | Aeling |
| 2009/0251917 A1 | 10/2009 | Wollner |
| 2010/0061093 A1 | 3/2010 | Janssen |

FOREIGN PATENT DOCUMENTS

| | | |
|---|---|---|
| DE | 20319650 U1 | 5/2004 |
| DE | 10308890 | 9/2004 |
| EP | 142380 | 5/1985 |
| EP | 392847 | 10/1990 |
| EP | 1416219 | 5/2004 |
| EP | 1473978 | 11/2004 |
| FR | 2131075 | 11/1972 |
| FR | 2601519 | 1/1988 |
| FR | 2694322 | 2/1994 |
| GB | 2031796 | 4/1980 |
| JP | S47-22093 | 10/1972 |
| JP | 56-063128 | 5/1981 |
| JP | S60-107084 A | 6/1985 |
| JP | 62-149180 | 7/1987 |
| JP | H01-062585 U | 4/1989 |
| JP | H01-123890 U | 8/1989 |
| JP | H01-157384 U | 10/1989 |
| JP | 8-020851 | 3/1990 |
| JP | 3-039819 | 6/1991 |
| JP | 04-32710 | 8/1992 |
| JP | 05-45812 | 6/1993 |
| JP | 05-38395 | 9/1993 |
| JP | 5-343847 | 12/1993 |
| JP | 06-37883 | 5/1994 |
| JP | 07-254770 | 10/1995 |
| JP | 07-296626 | 11/1995 |
| JP | 09-050253 | 2/1997 |
| JP | 09-115323 | 5/1997 |
| JP | 10-215069 | 8/1998 |
| JP | 10-288969 | 10/1998 |
| JP | 11-305699 | 11/1999 |
| JP | 2000-172205 | 6/2000 |
| JP | 2000-208938 | 7/2000 |
| JP | 2000-214803 | 8/2000 |
| JP | 2001-185761 | 7/2001 |
| JP | 2001-284504 | 10/2001 |
| JP | 2002-015869 | 1/2002 |
| JP | 2002-040972 | 2/2002 |
| JP | 2002-299694 | 10/2002 |
| JP | 2002-333847 | 11/2002 |
| JP | 2003-323141 | 11/2003 |
| JP | 2004-207649 | 7/2004 |
| JP | 2004-294687 | 10/2004 |
| JP | 2005-136288 | 5/2005 |
| JP | 2005-164952 | 6/2005 |
| JP | 2006-100397 | 4/2006 |
| JP | 2006-210537 | 8/2006 |
| KR | 10-1990-009091 | 12/1990 |
| KR | 10-2005-0060479 | 6/2005 |
| KR | 2005-100083 | 10/2005 |
| WO | WO 2005/028774 | 3/2005 |
| WO | WO 2005/068725 | 7/2005 |
| WO | WO 2006-010249 | 2/2006 |

OTHER PUBLICATIONS

Extended European Search Report for 08755104.0 completed Jun. 9, 2011, 6 pages.

International Search Report for PCT/US2006/008781, International Filing Date: Mar. 10, 2005, mailed Mar. 8, 2006, 4 pages.

International Search Report for PCT/US2007/077844, mailed Jan. 8, 2008, 2 pages.

International Search Report for PCT/US2007/078473, mailed Jan. 29, 2008, 2 pages.

International Search Report for PCT/US2008/062851, International Filing Date: May 7, 2008, mailed Sep. 12, 2008, 3 pages.

* cited by examiner

ILLUMINATION DEVICES AND METHODS FOR MAKING THE SAME

CROSS-REFERENCE TO RELATED APPLICATIONS

This application is a Continuation of application Ser. No. 13/955,455, filed Jul. 31, 2013, which is a Continuation of application Ser. No. 11/756,971, filed Jun. 1, 2007, which claims the benefit of U.S. Provisional Application No. 60/825,245, filed Sep. 11, 2006, which is incorporated by reference herein.

FIELD

The present disclosure relates to illumination devices, and more particularly to thin, illumination devices utilizing thin layers having circuitry and illumination devices and capable of being cut into various shapes.

BACKGROUND

Illumination devices that use circuitry and light management devices are known in the art in numerous applications. Such devices include a light source, and electrical circuit to power the light source and some light management device, such as a reflector or a diffuser to direct light produced by the light source in a desired manner. Such devices may be used, in particular, to attempt to provide illumination with minimal space utilization particularly in the case of thin light guides or light management devices. Known light devices and fixtures used primarily for providing illumination, however, typically utilize bulky housings containing lighting devices such as incandescent light bulb fixtures or similar lighting devices. In particular, applications, such as signs, channel letters and displays, for instance, these known illumination devices utilize a relatively large amount of space.

Lighting devices which employ a circuit substrate may be a fiberglass substrate patterned with copper circuits and mounting holes for components. Such rigid circuit boards, known as FR4 circuit boards, are made to be stiff and rigid by design. Therefore, they are not suitable to mounting onto surfaces that are not flat. Flexible circuits exist, and are typically made of patterned copper on films such as those sold under the tradename KAPTON polyimide films. These circuits offer the benefit of flexibility, but suffer from higher manufacturing costs. In addition, these circuits are typically made by a step and repeat patterning process. Such a process provides a great deal of difficulty in aligning features on the layers and also in making connections between layers. Therefore, such a process is expensive and high maintenance.

SUMMARY

The present disclosure is generally directed to illumination devices and methods for making the same. In particular, the present disclosure is directed to illumination mats having an array of LEDs. These illumination mats can be formed as thin composite films that are flexible and cut to any size, as desired.

In one embodiment, the device includes a first conductor layer, a first insulator layer disposed on the first conductor layer and having at least one first aperture defined therein through the first insulator layer, a second conductor layer disposed on the first insulator layer and having at least one second aperture defined therein through the second conductor layer and positioned to align with the at least one first aperture, and a light manipulation layer disposed on the second conductor layer and having at least one pair of apertures defined therein through the light manipulation layer including a third aperture and a fourth aperture, where the third aperture is positioned to align with the at least one second and first apertures.

In another embodiment, a method of making an illumination device includes disposing a first insulator layer on a first conductor layer, the first insulator layer defining at least one first aperture through the first insulator layer, disposing a second conductor layer on the first insulator layer, the first insulator layer defining at least one second aperture through the second conductor layer and positioned to align with the at least one first aperture, and disposing a light manipulation layer defining at least one third and fourth apertures through the light manipulation layer such that the at least one third aperture is positioned to align with the at least one first and second apertures.

In a further embodiment, an illumination device includes a first film layer having a light manipulative property, a conductor pattern disposed on a side of the first film layer, and at least one light source disposed on the side of the first film layer and in electrical communication with the conductor pattern.

DETAILED DESCRIPTION

Figure 1:
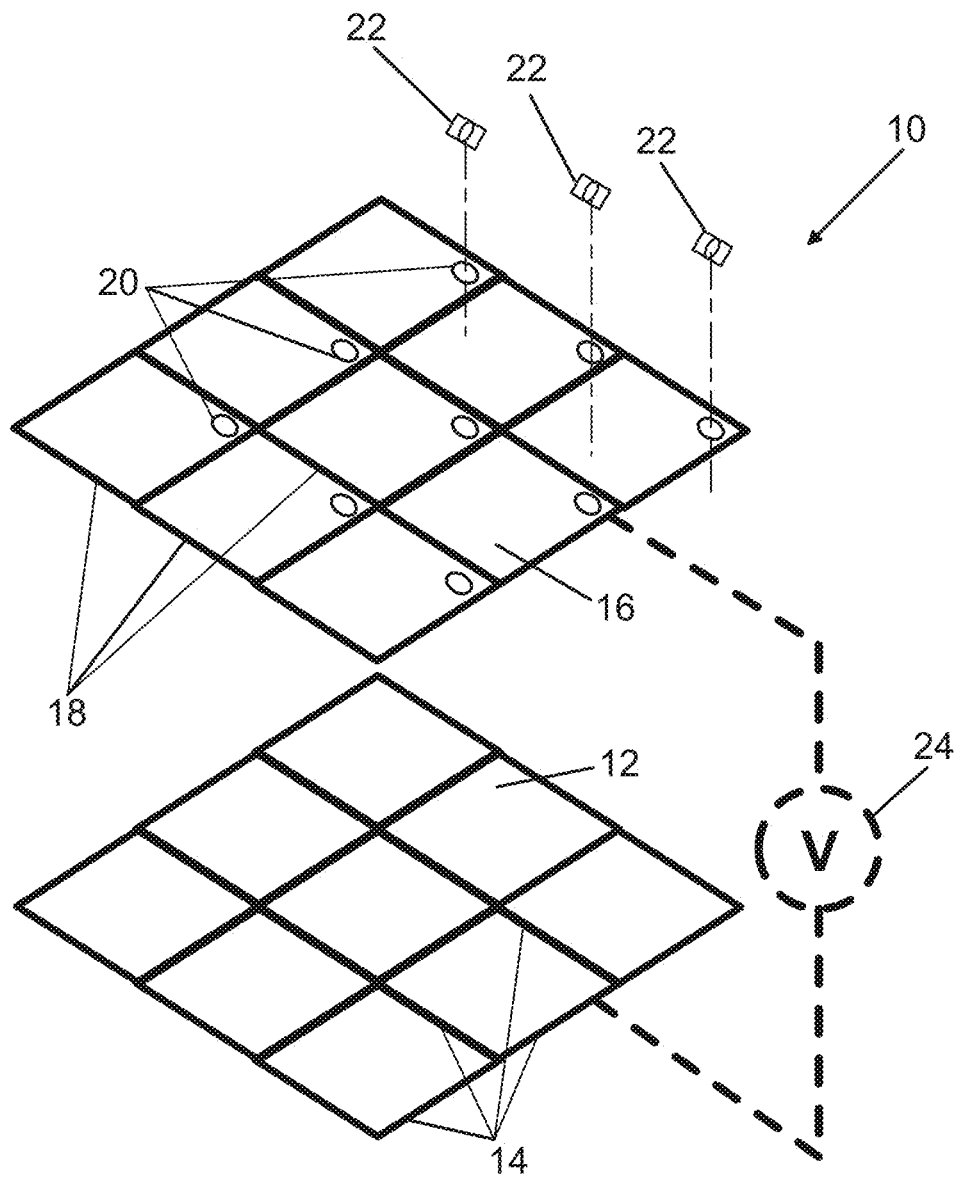
FIG. 1 is a perspective exploded view of an example of a disclosed illumination device.

The present disclosure features illumination devices and methods for making such devices having thin profiles to provide lighting devices that are thinner and take up less space than lighting devices known in the conventional art and are capable of being easily cut into various shapes. Such illumination devices may be utilized in a wide variety of applications. One such application may be for use in situation where space is limited or the illumination device is desirably low profile. One such example may include illuminated signs sometimes referred to as "light boxes." Illuminated signs are often used to enhance the presentation of images and/or text. Examples of illuminated signs can be found in airports, mass-transit stations, shopping malls and other public places, for example. The signs typically include an enclosure having an illuminated face over which a graphic (including images and/or text) is located. The disclosed illumination devices may be used to affect such types of illuminated signs by including at least one light source and a light transmissive device, with the device being either flat, at least substantially flat, or curved. The disclosed illumination devices may be used to illuminate channel letters where the disclosed illumination mats can be cut to fit the particular shape of the channel letter and provide uniform illumination of the channel letter. Another application is of use in backlit displays, for example, liquid crystal displays as may be used for active signs, televisions, and computer monitors. Another application is for use in vehicles where minimization of size and weight is a concern.

As used herein, the term "vehicle" is defined broadly as a means of carrying or transporting something. Types of vehicles which may utilize the illumination devices disclosed herein include, by way of non-limiting example, automobiles, trucks, buses, trains, recreational vehicles, boats, aircraft, motorcycles, and the like.

As also used herein, the term "light source" means any solid state lighting device, including, by way of non-limiting example, LEDs, fluorescent or incandescent lamps, electroluminescent lights, and other similar light sources.

As used herein, the term "light transmissive layer" means any material that transmits or alters transmission properties of visible light. Non-limiting examples of altering properties include reflection, refraction, dispersion, diffraction, and interference.

The illumination devices disclosed herein provide lighting for use in signs, displays, vehicles or buildings that are thinner, relatively inexpensive, more efficient, evenly illuminating, and aesthetically attractive. These illumination devices are formed of flexible materials that allow the illumination device or light mat to be elastically deformed about a cylindrical object of any diameter such as, for example, a diameter of 1 cm, or 2 cm, or 5 cm, or 10 cm. In many embodiments, these illumination devices can be assembled on a roll-to-roll apparatus in film/layer format forming a continuous web of illumination light mat that can be cut into any useful size or shape as described in concurrently filed U.S. patent application Ser. No. 11/756,905, incorporated by reference herein.

It is noted here that, unless otherwise noted, all parts, percentages, and ratios reported in examples described in this disclosure are on a weight basis.

When terms such as "above", "upper", "atop", "upward", "beneath", "below", "lower" and "downward" are used in this application to describe the location or orientation of components in an illumination device, these terms are used merely for purposes of convenience and assuming that the viewing face of the illumination device is horizontal and is viewed from above. These terms are not meant to imply any required orientation for the completed illumination device or for the path taken by supplied or ambient light in actual use of the completed device.

In a basic embodiment, the device includes a circuit capable of delivering an electric current. The device includes an electrically insulating layer bonded to a conductive layer. These layers may be bonded by a permanent bond or may be removable from each other. The connection may be made by a number of methods. In some embodiments, the connection is made by a mechanical process. That is, the bond is formed between two separate layers, and the conductive layer is not chemically deposited onto the electrically insulating layer. For example, a lamination process or joining the electrically insulating layer and the conductive layer together with an adhesive. As described above, the device may include a bottom film covering the multilayer circuit. The bottom film may be an additional electrically insulating layer or a separate polymer film, or a combination of both.

FIG. 1 illustrates an example of an illumination device 10 according to the present disclosure. Device 10 is shown having a first layer 12, which may be either flexible or rigid. In many embodiments first layer 12 is a multi layer film having light reflective properties, such as a reflector material. It is noted that reflector materials impart various qualities to the light, such as color or reflective properties (i.e., mirror). Reflector materials may be mirror films, opaque films or other materials capable of light reflection. An example of suitable high reflectivity materials include Vikuiti™ Enhanced Specular Reflector (ESR) multilayer polymeric film available from 3M Company; a film made by laminating a barium sulfate-loaded polyethylene terephthalate film (2 mils thick) to Vikuiti™ ESR film using a 0.4 mil thick isooctylacrylate acrylic acid pressure sensitive adhesive, the resulting laminate film referred to herein as "EDR II" film; E-60 series Lumirror™ polyester film available from Toray Industries, Inc.; Light Enhancement Film 3635-100 (LEF) available from 3M Company, porous polytetrafluoroethylene (PTFE) films, such as those available from W. L. Gore & Associates, Inc.; Spectralon™ reflectance material available from Labsphere, Inc.; Miro™ anodized aluminum films (including Miro™ 2 film) available from Alanod Aluminum-Veredlung GmbH & Co.; MCPET high reflectivity foamed sheeting from Furukawa Electric Co., Ltd.; and White Refstar™ films and MT films available from Mitsui Chemicals, Inc. Layer 12 could also be translucent or transparent if it were combined with layer 16 being the reflector.

A first conductor pattern 14 is disposed on a surface of the first layer 12. The conductor pattern 14 may include conductive ink, such as silver ink, or a thin conductor pattern, such as copper or aluminum foil, or a combination thereof (e.g., plating conductive ink with copper or similar conductive metal). In some embodiments, the conductor pattern 14 is formed in selected patterns by screen printing, shadow masking, photolithography, etching, ablating, or laser induced thermal imaging, as examples. In many embodiments, the conductor pattern may be formed by a electrically conductive sheet such as copper or aluminum foil, for example, that may be continuous or patterned, for example by rotary die cutting, laser patterning, water jet cutting, or other cutting ways commercially available. This conductive pattern 14 may be a separate layer, laminated onto the surface of the first layer 12, or alternately, be positioned and secured between layers 12 and 16 and then bonded together. Circuit configurations may include busses in grid pattern as illustrated in FIG. 1, or any other desired pattern.

Device 10 further includes a second layer 16 configured to engage with the first layer 14. In some embodiments, the second layer 16 is composed of a transparent polyester film, or any other suitable film which affords light transmission, whether transparent, semi-transparent, or translucent. In many embodiments, layer 16 is a reflector film, as described above, either to replace the reflector base film layer 12 or enhance it. In some embodiments, either the bottom surface of second layer 16 engaging with the upper surface of first layer 12, or the upper surface of first layer 12 having the conductor pattern 14 includes an adhesive (that can be light transmissive), that is used to affix the first and second layers 12, 16 together. In many embodiments, the layers 12 and 16 are laminated together to form an integral device.

The second layer 16 includes a second conductor pattern 18, which is configured and assembled similar to the first conductor pattern 14, discussed above. Second layer 16 also includes one or more apertures or vias 20 that are located so as to align with portions of first conductor pattern 14 when the first and second layers 12 and 16 are conjoined, allowing access to first conductor pattern 14 from the upper surface of second layer 16, as will be discussed more fully in connection with FIGS. 2-5.

It is further noted that layer 16 is shown as a film, but may also be a printed layer.

Device 10 also includes one or more light or illumination sources 22, which may be one or more light emitting diodes (LEDs) having two contacts (i.e., an anode and cathode), but are not limited to such. Examples of LEDs that may be used include LEDs of various colors such as white, red, orange, amber, yellow, green, blue, purple, or any other color of LEDs known in the art. The LEDs may also be of types that emit multiple colors dependent on the polarity of the applied power, or of types that emit infrared or ultraviolet light. Furthermore, the LEDs may include various types of packaged LEDs or bare LED die, as well as monolithic circuit board type devices or a configuration using circuit leads or wires. As indicated in FIG. 1, the light sources 22 are located such that at least a portion of the light source 22 is over the apertures 20. This allows one of the contacts of a light source 22 to contact or be electrical communication with the first conductor 14 through the apertures 20. The other contact of the light source 22 is in electrical communication with second conductor pattern 18. Accordingly, a source of power, such as a voltage source 24, may then be connected across the first and second conductor pattern 14 and 18, as illustrated, to supply power to drive the light sources 22.

Figure 2:
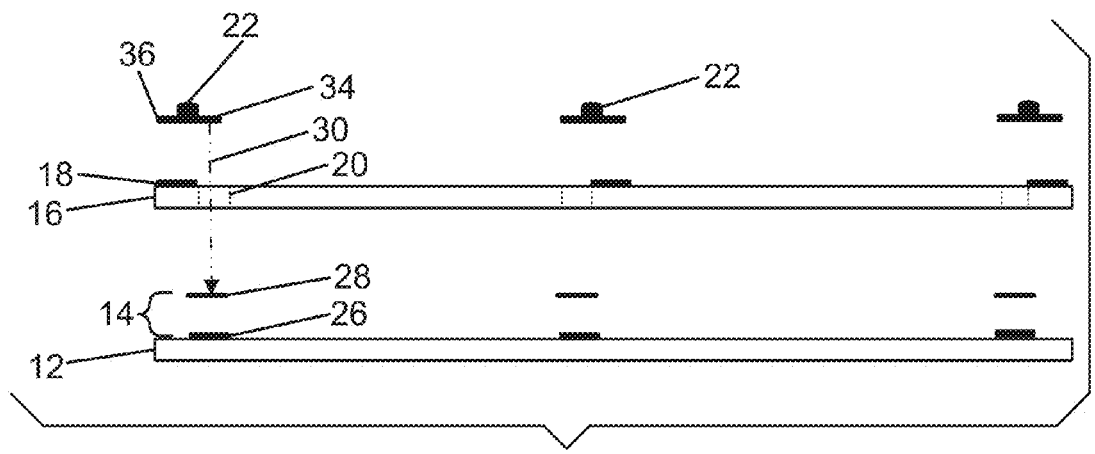
FIG. 2 is an exploded side view of the device of FIG. 1.

FIG. 2 is an exploded side view of the device 10 of FIG. 1 and like reference numerals refer to the same elements as shown in FIG. 1. As may be seen in FIG. 2, the first layer 12 includes one or more conductor patterns 14 disposed on an upper surface thereof. In the example illustrated, the conductor patterns 14 may be composed of conductive ink traces 26 plated with copper or copper foil 28, as described above. A portion of the light sources 22 may then make electrical connection or communication with the conductor pattern 14 through the apertures 20 as indicated by an arrow 30. It is noted here that the dimensions of the elements of device 10 illustrated in the figures is not exact, but merely illustrates the disclosed arrangement of elements. Accordingly, the thicknesses of layers 12 and 16 and conductor patterns 14 and 18 are greater than would be utilized in practice. Thus, the distance to which one of the contacts of light source 22 extends through via 20 in order to make contact with conductor pattern 14 is small and a protrusion, extension, or lead from light source 22 to make contact with pattern 14 may not be necessary. Alternately, it is possible that resistors, or resistive material can be bonded or deposited into the apertures in order to bring the lower contact pattern into proximity with the upper contact pattern. This would serve the additional function of providing a current limiting resistance for each LED. Alternately, the resistive material can be selected to have a positive temperature coefficient, which could provide the additional benefit of further limiting current to each LED based on ambient and LED temperatures.

Figure 3:
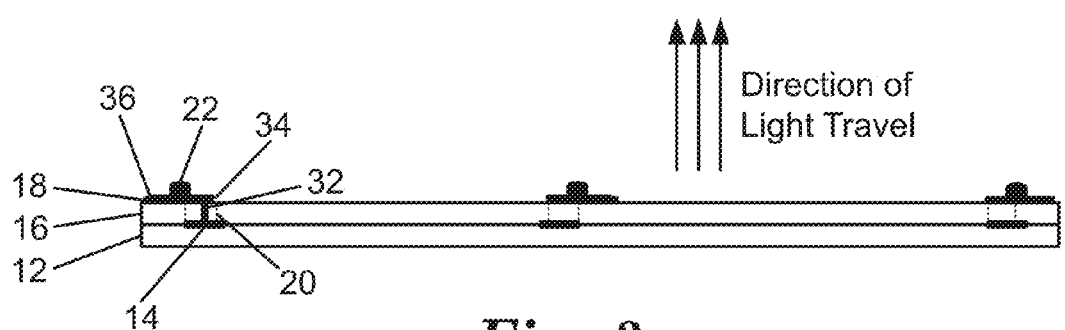
FIG. 3 is a side view of the device of FIG. 1.

FIG. 3 illustrates an assembled side view of the device 10 of FIG. 1 showing the conjoining of layers 12 and 16. As mentioned above, the dimensions of the figures are not intended to illustrate exact dimensions and the degree of distance for electrical contact or communication of the light source with pattern 14 is small. Nonetheless, FIG. 3 illustrates electrical connection with connections 32 (representational only and not intended to illustrate a specific physical connection) of a portion 34 of light source 22 to conductor pattern 14. Another portion 36 of light source 22 is in electrical contact or communication with conductor pattern 18. It is noted that the patterns 14 and 18 may be offset as illustrated in FIGS. 2 and 3, or may alternatively be located directly one over the other. In such case, the apertures 20 may be located within pattern 18, but electrically insulated from the circuit of pattern 18 and also not affecting circuit continuity of pattern 18.

It is noted that light extraction from the one or more light sources 22 may also be enhanced by encapsulating, coating or applying a light transmissive film over the light sources 22 in order to improve extraction efficiency at the surface of an LED, for example, by defeating total internal reflection at the LED/light transmissive interface, and/or to provide protection to the light sources 22. This may be accomplished by providing uniform light distribution by guiding light within the encapsulating material or coating using total internal reflection. Furthermore, diffuse light distribution from within the medium by reflection or scattering may be produced by incorporating nanoparticles, glass microspheres, metal powder, chopped ESR, or Bragg gratings, as examples. Additional directed light distribution from within the medium may be achieved using prismatic or microstructured surfaces, lenslet arrays, shaped ribs, or random chaotic surface patterns, as examples.

Figure 4:
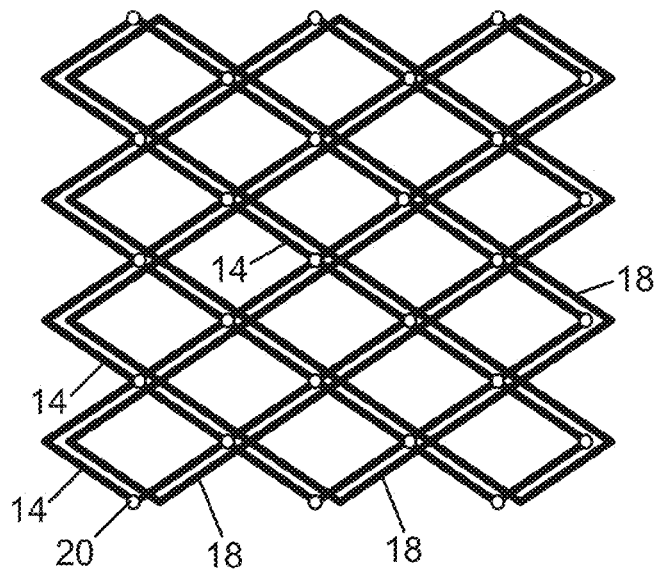
FIG. 4 is a plan view of the device of FIG. 1 showing the positional relationship between conductor patterns of the device of FIG. 1 without light emitting devices shown.

FIG. 4 is an illustrative plan view of the device of FIG. 1 showing an exemplary positional relationship between conductive traces of the device of FIG. 1 without light sources shown. In particular, the conductor grid pattern 18 is located above conductor grid pattern 14 and is at the same height as apertures 20. As may be seen, the apertures 20 are positioned such that they are directly located over pattern 14 when device 10 is assembled. This is illustrated by the conductor pattern 14 intersecting the apertures 20.

Figure 5:
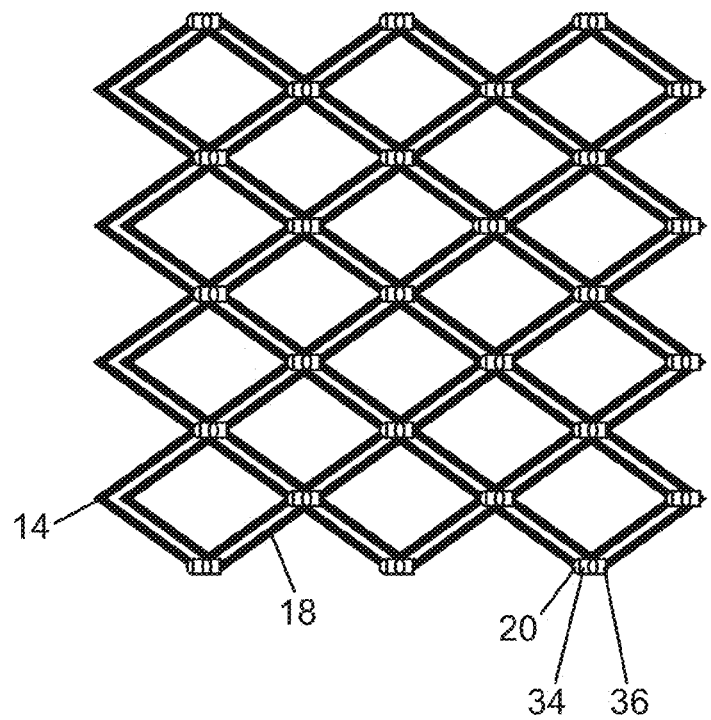
FIG. 5 is a plan view of the device of FIG. 1 showing the positional relationship between conductor patterns and light emitting devices of the device of FIG. 1.

FIG. 5 shows the plan view of the device 10 illustrated in FIG. 1 and FIG. 4 showing the positional relationship between conductive traces and light emitting devices or sources 22 (see also FIGS. 2 and 3). As shown, each light source 22 has a portion 34 positioned over an aperture 20 to effect contact of the light source with conductor pattern 14 through the aperture 20. Another portion 36 of each light source 22 is positioned to electrically contact conductor pattern 18.

When the exemplary device 10 is assembled, as shown in FIG. 3, for example, the light reflective surface of the first layer 12 serves to project the light in a direction away from the upper surface of the second layer as shown in FIG. 3. Moreover, by utilizing a grid array or similar variant, the device 10 may be cut to form desired cut patterns. Power is then simply applied across the first and second layers to cause the light sources 22 to illuminate. In an alternative example, it is contemplated that device 10 may be implemented by simply printing circuit patterns or traces on both sides or surfaces of a light manipulating film. This would yield, for example, a "positive" side on one surface and the "negative" side of the circuit on the other side. By positioning LEDs to connect between the circuits via apertures 20 utilizes the dielectric nature of the coated sheet to allow intersecting circuit patterns. Using this methodology engenders the ability to produce a light mat that can be cut into any desired pattern and then powered simply by connecting to any point on the top and another point on the bottom.

In another alternative, a similar structure to device 10 can be produced on a single side of a sheet by first printing and plating a first circuit or conductor pattern. This is followed by printing a dielectric layer having apertures over at least a portion of the first circuit. Next, a second printed and plated circuit is disposed on top of the dielectric layer. Illumination sources (e.g., LEDs) are then be mounted, in part, through the openings in the dielectric such that they connect both the first and second conductive layers or patterns.

Figure 6:
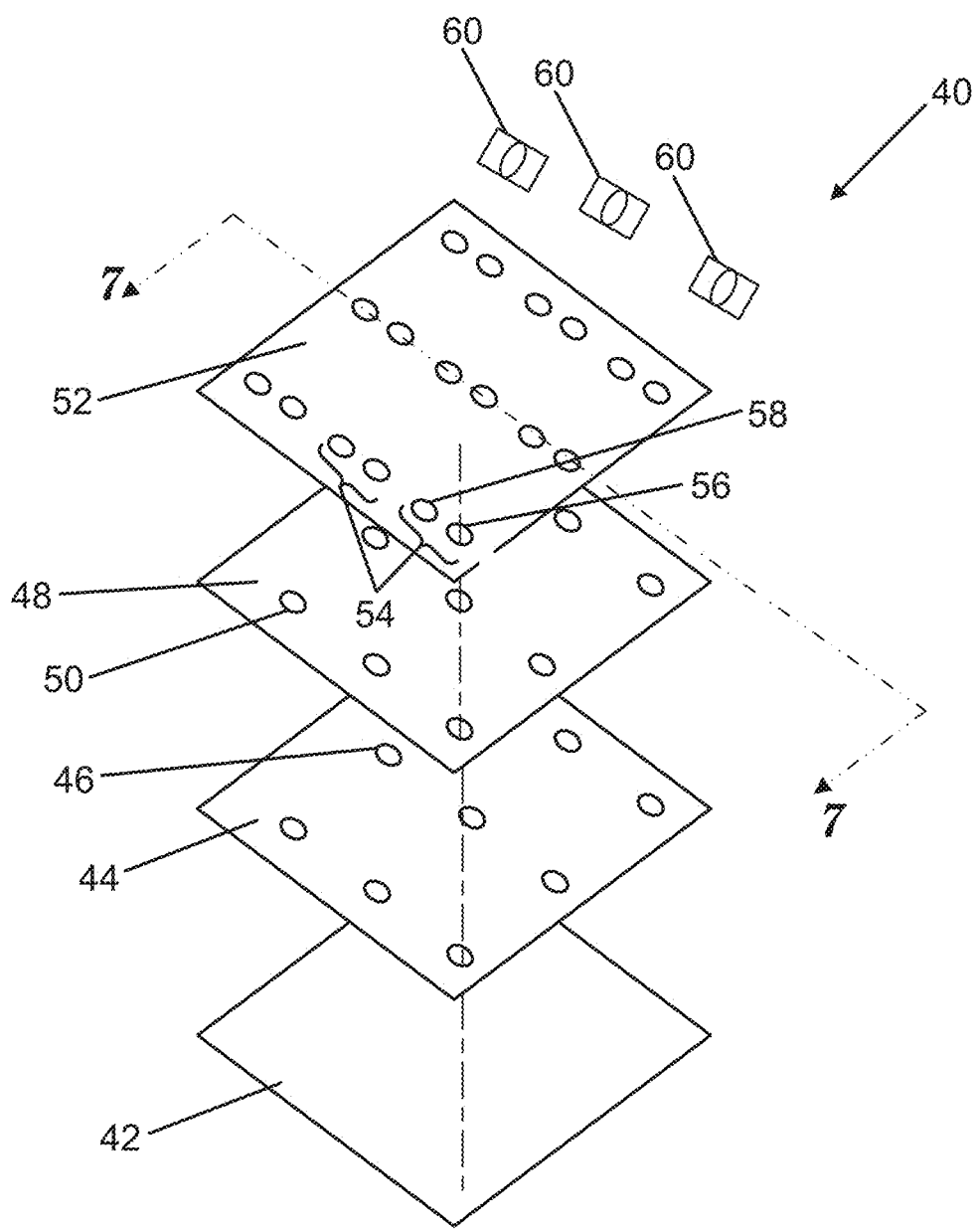
FIG. 6 is a perspective exploded view of another example of a disclosed illumination device.

FIGS. 6-9 disclose yet another example of a light source according to the present disclosure, which includes using a metal foil, rather than conductor patterns. FIG. 6 illustrates a perspective view of an illumination device 40 having multiple layers. A first conductor layer 42 may consist of a metal foil, such as a copper foil or other suitable conductor fashionable as a sheet or layer. Disposed on the first conductor layer 42 is a first electrical insulator or non-conductive layer 44. In some embodiments, another electrical insulating or non-conducting layer can be disposed beneath the first conductive layer 42, sandwiching the conductive layer 42 between the two non-conductive layers. The first electrical insulator layer 44 includes one or more apertures 46 through the layer. The first electrical insulator layer 44 may consist of any known electrical insulator or dielectric capable of being fashioned as a sheet or layer, or a light reflective layer, as described above. Additionally, layer 44 may include an adhesive on one or both sides for adhering layer 44 to adjoining layers such as first conductor layer 42.

Device 40 further includes a second conductor layer 48 disposed on the upper surface of first electrical insulator layer 44. Second conductive layer 48 includes one or more apertures 50 through the layer and may consist of a metal foil, such as a copper foil or other suitable conductor fashionable as a sheet or layer. Apertures 50 and 46 are configured to align or be in register with each other. Finally, device 40 includes an optical film layer 52. Optical film layer 52 may consist of a reflective material or have some other light manipulative property, as the light reflective films described above. Layer 52 includes one or more pairs of apertures 54, each pair 54 having first 56 and second 58 apertures. First aperture 56 aligns with or is in register with holes 46 and 50 in the first conductor layer 44 and the second conductive layer 50, respectively. FIG. 6 shows this alignment with vertical dashed line. Thus, an illumination source having at least two terminals, such as an LED with anode and cathode terminals, disposed on the upper surface of layer 52 may make electrical contact with first conductor layer 42 through apertures 56, 50, and 46. The other terminal of the light illumination source can be in electrical communication with the second conductor layer 48 through apertures 58. In some embodiments, layer 52 includes a single large aperture that replaces each pair 54 of first 56 and second 58 apertures.

Device 40 also includes one or more light or illumination sources 60, which may be one or more light emitting diodes (LEDs) having two contacts (i.e., an anode and cathode), but are not limited to such. Examples of LEDs that may be used include LEDs of various colors such as white, red, orange, amber, yellow, green, blue, purple, or any other color of LEDs known in the art. The LEDs may also be of types that emit multiple colors dependent on whether forward or reverse biased, or of types that emit infrared or ultraviolet light. Furthermore, the LEDs may include various types of packaged LEDs or bare LED die, as well as monolithic circuit board type devices or a configuration using circuit leads or wires.

It is noted that either the upper surface of second conductor layer 48 or the bottom surface of the optical film layer 52 may include an adhesive to affix layers 48 and 52 together. Additionally, the layers of assembled device 40 are laminated together to achieve a unitary construction.

Figure 7:
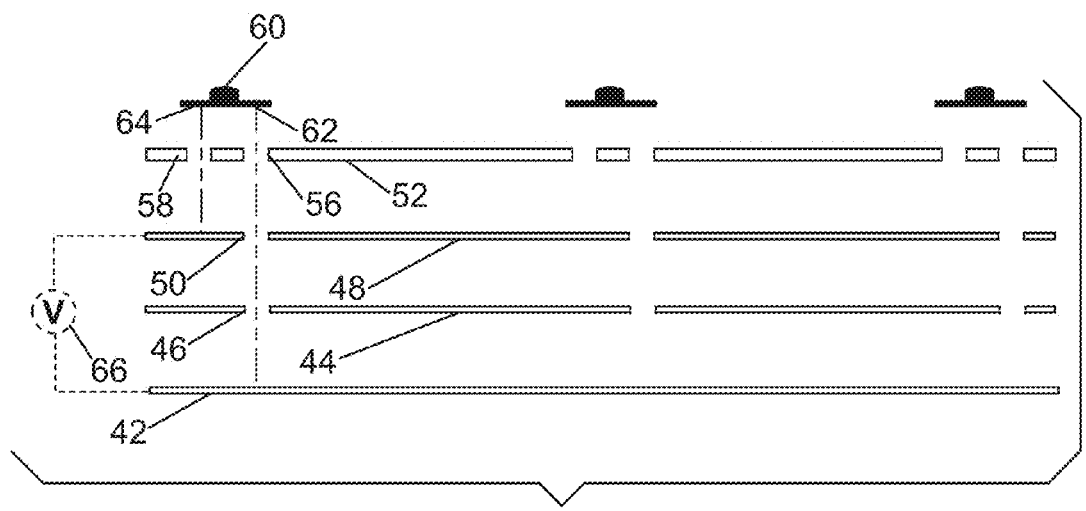
FIG. 7 illustrates an exploded cross section of the device of FIG. 6 through section line 7-7.

FIG. 7 illustrates an exploded cross section of the device of FIG. 6 through section line 7-7 extending the entire vertical cross section distance of device 40. As illustrated, a portion 62 of an illumination source 60 is positioned over aligned apertures 56, 50, and 46 to allow electrical communication between portion 62 and the first conductor layer 42. Another portion 64 of the illumination devices 60 is positioned over aperture 58, affording electrical communication between portion 64 and second conductive layer 48. Accordingly, a source of power, such as a voltage source 66, may then be connected across the first and second conductor layers 42 and 48, as illustrated, to supply power to drive the illumination source 60.

Figure 8:
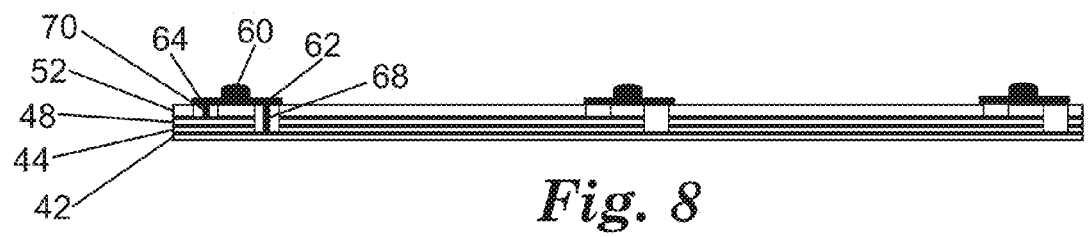
FIG. 8 illustrates the assembled cross sectional view of the device illustrated in FIG. 7.

FIG. 8 illustrates the assembled cross section view of the device 40 illustrated in FIG. 7. As shown, FIG. 8 illustrates an assembled device showing the layered construction including layers 42, 44, 48, and 52. As mentioned previously, the dimensions of the figures are not intended to illustrate exact dimensions and the degree of distances for electrical contact or communication of the light source 60 with the first and second conductor layers 42 and 48 are small. Nonetheless, FIG. 8 illustrates electrical connection with connections 68 and 70 (representational only and not intended to illustrate a specific physical connection) of portions 62 and 64 of light source 60 to layers 42 and 48, respectively.

Figure 9:
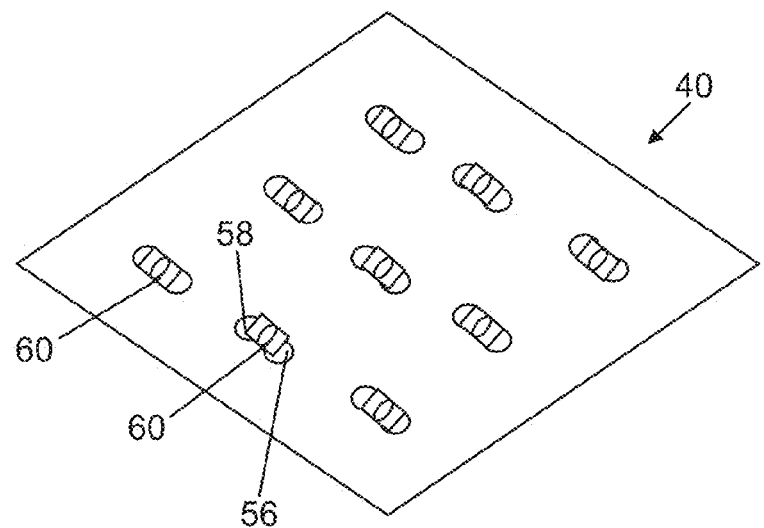
FIG. 9 is a perspective view of the assembled device of FIG. 6.

FIG. 9 is a perspective view of the assembled device 40 of FIG. 6, illustrating that the illumination sources 60 are disposed on the upper surface of device 40 connected across the pair of apertures 56 and 58.

Figure 10:
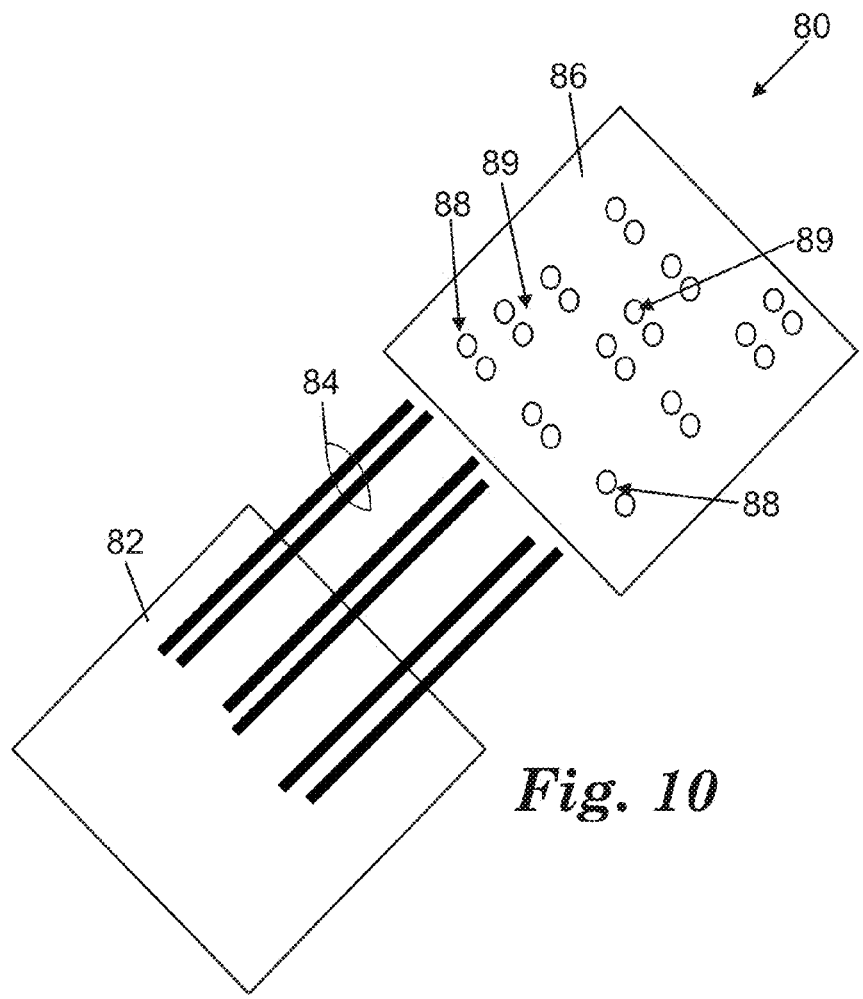
FIG. 10 is an exploded perspective view of another example of a disclosed illumination device.

FIG. 10 is an exploded perspective view of another example of a disclosed illumination device 80. As illustrated, the device 80 includes a carrier film 82, which may be electrically insulating. Disposed on the carrier film 82 is one or more pair of metal foil strips 84, such as copper foil. Disposed on the film 82 and strips 84 is a light manipulative film 86, such as a reflective film (e.g., any of the reflective films discussed previously herein). The film 86 includes at least a first pair of holes 88 or 89, each of the holes in pair 88 or 89 aligning with respective strips of the pair of strips 84. An illumination source, such as an LED 90 (shown in FIG. 11) may then be positioned over the holes 88 to respectively communicate with positive and negative potentials of a power supply connected to the strips 84.

Figure 11:
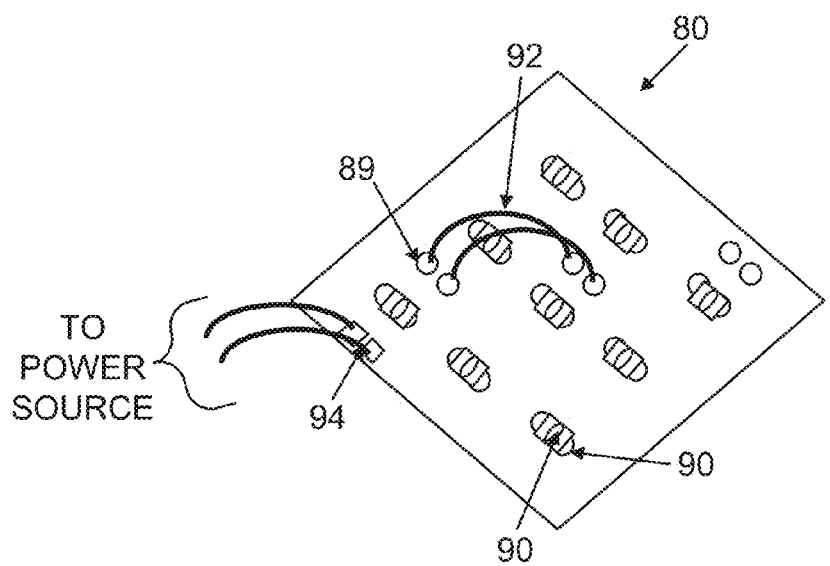
FIG. 11 is a perspective view of the device of FIG. 10 shown in an assembled state.

FIG. 11 is a perspective view of the device of FIG. 10 shown in an assembled state.

These figures further illustrate that layer 86 includes at least two or more pair of holes correspondingly aligned to a respective pair of foil strips 84 may be jumpered by conductors 92 (above or below the layer 86) to provide power to one or more additional groups of light sources electrically communicated with a pair of foil strips 84. Thus, the device 80 may fashioned in a sheet and cut to a desired size, and only one power supply or access connection 94 is needed for the device with an appropriate number of conductor jumpers 92 to power all LEDs in the cut sheet.

It is noted that the layers of device 80 may be laminated all together, place LED attach electrical connections.

The devices disclosed herein can include more conductive layers and insulating layers than is illustrated in the figures, depending on the nature of desired circuit or number of circuits on each device. For example, a further insulating layer can be laminated between two additional conductive layers to produce a second circuit on each device.

Figure 12:
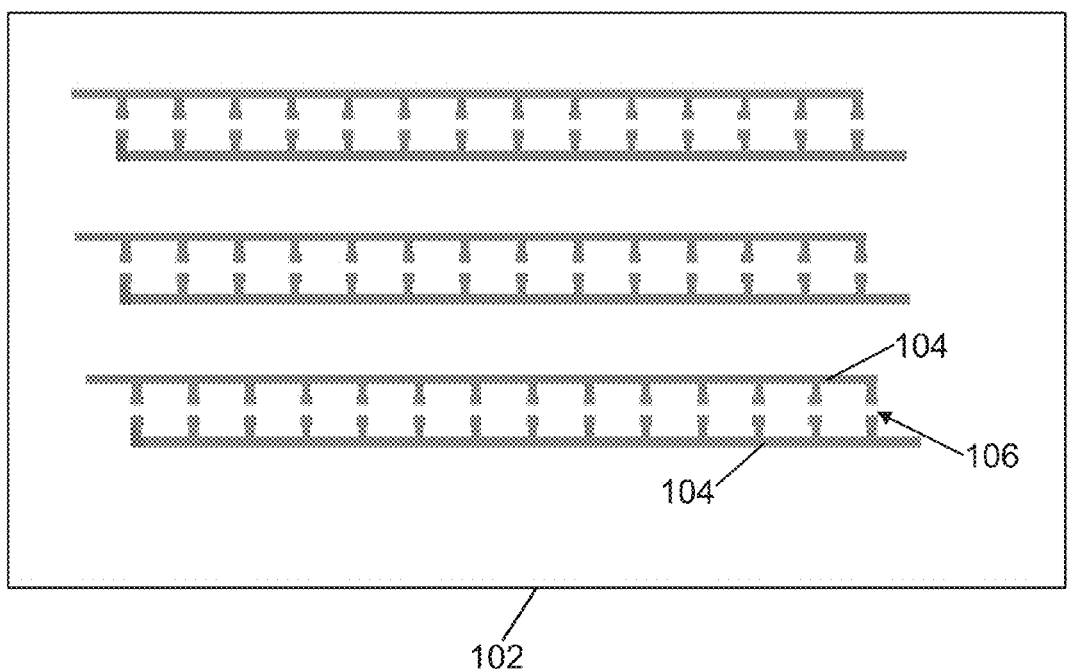
FIG. 12 is a plan view of another example of a disclosed illumination device.

FIG. 12 is a plan view of another example of a disclosed illumination device 100. This device 100 can be printed on a reflective film 102 using a silver-based conductive ink to create conductor patterns 104. Copper can then be plated onto the conductive ink using standard electrochemical plating processes. Light sources such as LEDs can be soldered across the gaps 106 creating a parallel circuit that can be powered from either end. With this method the conductivity of the circuit was increased by the plating process from 5.5 ohms for ink printed to 0.5 ohms for the ink with plating. The higher conductivity allowed mounting and lighting of the entire string of LEDs where a circuit prepared by printing only would only brightly light the first 1 or 2 LEDs. This circuit is built on reflective films such as were described above The exemplary structures and methods described above may be used as illustrated, or in combinations. That is, an alternative could include a lower conductor pattern made of copper foil and an upper circuit or conductor pattern printed on an optical film. In another alternative, the lower circuit could be printed and the upper circuit could be a copper foil.

It is noted that instead of copper foil for a conductor patterns or layers, aluminum or other conductive metal foil may be utilized. Furthermore, in place of foil, it is contemplated that polyester coated with a metallic conductor may also be utilized. Moreover, all of the disclosed layers could be implemented by films laminated together or coatings printed on top each other.

The illumination devices described herein provide relatively thin illumination devices that are particularly useful for illumination applications where the thickness of the illumination element is desired to be minimized. In some embodiments, the total thickness of the illumination device or mat (excluding the light source) is in a range from 100 micrometers to 2000 micrometers, or from 100 micrometers to 1000 micrometers, or from 250 micrometers to 750 micrometers. The plurality of layers that form the illumination devices or mats described herein can have any useful thickness. In many embodiments, the conductor layers have a thickness in a range from 10 micrometers to 50 micrometers, or from 20 micrometers to 30 micrometers, and the insulator layers and/or light manipulation layers (including optional adhesive layer of 10 to 30 micrometers) each have a thickness in a range from 25 micrometers to 250 micrometers, or from 25 micrometers to 150 micrometers. In many embodiments, the light source is an LED having a thickness in a range from 75 micrometers or greater.

The illumination devices described herein provide lighting devices that are capable of being cut to various desired shapes. The shapes may include linear shapes or shapes that are more complex. Such illumination devices are suitable for use in a variety of applications for illuminating surfaces, such as the interior or exterior surfaces of vehicles as an example. In addition, the disclosed illumination devices may be used in other applications such as interior or exterior lighting for buildings, backlighting signs, and displays, as was mentioned previously.

The illumination devices described herein can have one or more electrical circuits that power the lights sources. In many embodiments, the electrical circuits are parallel electrical circuits. In some embodiments, the electrical circuits are a plurality of parallel circuits that allow the illumination device or mat to be cut along the length and/or width of the illumination device or mat while still allowing the circuits to be electrically coupled to a voltage source and power the light sources.

The illumination devices described herein are suitable for use on any surface of a vehicle traditionally provided with lighting such as overhead dome lighting, glove box lighting, floor lighting, map lights, mirror lights, decorative lights, rear window brake lights, and the like. In addition, the illumination devices described herein are suitable for providing lighting in places where prior art lighting systems would be difficult or impractical. Due to the thin construction of the devices and the configuration of the light source, the illumination devices of the present disclosure may be installed in confined spaces. In addition, the illumination devices of the present disclosure may be installed in light boxes for advertising, including sign boxes, channel letters, and the like. Due to the flexible construction, the illumination devices described herein may be installed on curved surfaces.

The illumination devices described herein are also suitable for display applications. These illumination devices are particularly useful as a backlight or edge light for a liquid crystal display panel, as may be used for advertising display, TV, DVD, or computer monitor applications.

As one skilled in the art will appreciate, varieties of combinations of the components described herein are possible to provide suitable illumination devices. For example, it is anticipated that the disclosed devices of the present disclosure may be formed from other flexible materials, as well as the conductive regions, layers and patterns being constructed from flexible materials. For example, copper etched circuits on polyester teraphthalate (PET) or polyamide such as those obtained under the trade designations "Flexible Circuits" from 3M Company. Transparent conductive regions may also be prepared by pattern sputter coating indium tin oxide (ITO) on a polyester film, obtained from CP Films, Inc., Martinsville Va. Another option for creating conductive region patterns is to laser ablate or etch the patterns from a full sheet of ITO coated polyester.

It is further contemplated that the illumination devices of the present disclosure may subsequently be molded into various illuminated artifacts, including, but not limited to, buttons, coffee cups, traffic delineators, window housings, body side moldings, bumper covers, furniture, countertops, toilet seats, shower doors, and the like.

It is still further contemplated that the disclosed illumination devices may alternately be coated with other suitable materials to protect the LEDs and provide index matching, including acrylic resins, polyvinyl butyral polymer, polyolefin resins, epoxy resins or silicone resins, etc. The resin could be filled with diffusing components such as glass beads, silica particles, fibers, or pigments.

While the illumination devices depicted in the figures show the devices as substantially planar articles, it should be appreciated that the devices may be constructed as a curved article. As one skilled in the art will appreciate, various combinations of the light management devices could be utilized with various configurations of light sources to produce an illumination device. Further, as one skilled in the art would appreciate, the entire structures shown herein may be encased in a housing.

The optical qualities of the illumination devices described herein may be further enhanced by the use of additional light management films or layers. Suitable light management devices for use in the illumination devices described herein include, light control films for glare and reflection management, prismatic brightness enhancement films, diffuser films, reflective films, reflective polarizer brightness enhancement films, reflectors and turning films, and liquid crystal display panels.

It is further noted that the whole constructions of the devices described herein may include adhesive on either the back or front surfaces thereof to attach the device to some other structure.

The present disclosure also incorporates by reference pending PCT application number US2006/008781 filed Mar. 10, 2006 and entitled "ILLUMINATION DEVICES AND METHODS FOR MAKING THE SAME."

One skilled in the art will also appreciate that light sources used in the devices described herein can be provided in a variety of forms. The light source may be, for example, a linear or non-liner array of one or more LEDs, or other form of light source such as fluorescent or incandescent lamps, electroluminescent lights and the like. In other examples, a matrix or grid of LED lights may be used. In some examples, the light may be colored. In still other examples there may be more than one light source provided in the illumination device. The light source may include a dimmable control, on/off control, color control and the like.

In light of the foregoing, the present disclosure provides illumination devices that are thin, efficient, evenly illuminating, and aesthetically attractive. Additionally, aspects of the disclosed illumination devices afford ease of use, such as easy attachment to surfaces such as automobile windows and other interior or exterior surfaces, or display surface.

The above-detailed examples have been presented for the purposes of illustration and description only and not by limitation. It is therefore contemplated that the present disclosure cover any additional modifications, variations, or equivalents that fall with in the spirit and scope of the basic underlying principles disclosed above and the appended claims.

What is claimed is:

1. An illumination device comprising:
    a first conductor layer;
    a first insulator layer disposed on the first conductor layer and having at least one first aperture defined therein through the first insulator layer;
    a second conductor layer disposed on the first insulator layer and having at least one second aperture defined therein through the second conductor layer and positioned to align with the at least one first aperture;
    a light manipulation layer disposed on the second conductor layer and having at least one pair of apertures defined therein through the light manipulation layer including a third aperture and a fourth aperture, where the third aperture is positioned to align with the at least one second and first apertures,
    at least one light source disposed on the first conductor layer in electrical communication with the second conductor layer pattern through the first aperture,
    wherein the total thickness of the first conductor layer, the first insulator layer, the second conductor layer, and the light manipulation layer is 100 micrometers to 1000 micrometers.

2. An illumination device according to claim 1, wherein at least one of the first and second conductors comprises a metal conductor comprised of least one of copper, silver, gold, aluminum, palladium, and titanium.

3. An illumination device according to claim 1, wherein the device is substantially planar in shape.

4. An illumination device according to claim 1, wherein the device is curved.

5. An illumination device according to claim 1 in combination with art illuminated sign, building, vehicle, or display.

6. An illumination device according to claim 1, wherein the light manipulation layer is a light reflective layer.

7. An illumination device according to claim 1, wherein the light manipulation layer is a polymeric mirror film.

8. An illumination device according to claim 1, wherein the first insulator layer comprises a plurality of first apertures defined therein through the first insulator layer and a plurality of second apertures defined through the second conductor layer and positioned in registration with the plurality of first apertures and a plurality of third apertures and a plurality of fourth apertures defined in the light manipulation layer where the plurality of third apertures are in registration with the plurality of second apertures.

9. A method of making an illumination device comprising:
    disposing a first insulator layer on a first conductor layer, the first insulator layer defining at least one first aperture through the first insulator layer;
    disposing a second conductor layer on the first insulator layer, the first insulator layer defining at least one second aperture through the second conductor layer and positioned to align with the at least one first aperture; and
    disposing a light manipulation layer defining at least one third and fourth apertures through the light manipulation layer such that the at least one third aperture is positioned to align with the at least one first and second apertures,
    wherein the total thickness of the first conductor layer, the first insulator layer, the second conductor layer, and the light manipulation layer is 100 micrometers to 1000 micrometers.

10. A method according to claim 9, wherein the light manipulation layer is a light reflective layer.

11. A method according to claim 9, wherein the light manipulation layer is a polymeric mirror film.

12. A method according to claim 9, wherein the first insulator layer comprises a plurality of first apertures defined therein through the first insulator layer and a plurality of second apertures defined through the second conductor layer and positioned in registration with the plurality of first apertures and a plurality of third apertures and a plurality of fourth apertures defined in the light manipulation layer where the plurality of third apertures are in registration with the plurality of second apertures.

13. An illumination device comprising:
    a first conductor layer;
    a first insulator layer disposed on the first conductor layer and having at least one first aperture defined therein through the first insulator layer, wherein the first insulator layer is a light reflective layer;
    a second conductor layer disposed on the first insulator layer and having at least one second aperture defined therein through the second conductor layer and positioned to align with the at least one first aperture;
    a transparent layer disposed on the second conductor layer and having at least one pair of apertures defined therein through the transparent layer including a third aperture and a fourth aperture, where the third aperture is positioned to align with the at least one second and first apertures, and
    at least one light source disposed on the first conductor layer in electrical communication with the second conductor layer pattern through the first aperture.

* * * * *